(12) United States Patent
Tourino

(10) Patent No.: US 9,153,721 B1
(45) Date of Patent: Oct. 6, 2015

(54) SOLAR CELL ASSEMBLY, SOLAR CELL PANEL, AND METHOD FOR MANUFACTURING THE SAME

(71) Applicant: SolAero Technologies Corp., Albuquerque, NM (US)

(72) Inventor: Cory Tourino, Edgewood, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 14/793,289

(22) Filed: Jul. 7, 2015

Related U.S. Application Data

(62) Division of application No. 13/535,570, filed on Jun. 28, 2012, now Pat. No. 9,102,422.

(51) Int. Cl.
*H01L 31/042* (2014.01)
*H01L 31/05* (2014.01)
*H01L 31/048* (2014.01)
*H01L 31/041* (2014.01)

(52) U.S. Cl.
CPC .......... *H01L 31/0508* (2013.01); *H01L 31/041* (2014.12); *H01L 31/048* (2013.01); *H01L 31/0512* (2013.01)

(58) Field of Classification Search
None
See application file for complete search history.

(56) References Cited

U.S. PATENT DOCUMENTS

| | | | |
|---|---|---|---|
| 3,375,141 A | 3/1968 | Julius | |
| 5,180,689 A * | 1/1993 | Liu et al. | 438/640 |
| 6,543,725 B1 | 4/2003 | Meurer et al. | |
| 7,423,346 B2 * | 9/2008 | Lin et al. | 257/758 |
| 7,498,508 B2 | 3/2009 | Rubin et al. | |
| 7,732,705 B2 | 6/2010 | Stan et al. | |
| 2003/0047206 A1 | 3/2003 | Kawam | |
| 2008/0000523 A1 | 1/2008 | Hilgarth et al. | |
| 2010/0031994 A1 | 2/2010 | Varghese | |
| 2010/0186804 A1 | 7/2010 | Cornfeld | |
| 2010/0218805 A1 | 9/2010 | Everett et al. | |
| 2010/0233839 A1 | 9/2010 | Cornfeld et al. | |
| 2010/0282288 A1 | 11/2010 | Cornfeld | |
| 2014/0000672 A1 | 1/2014 | Tourino | |

FOREIGN PATENT DOCUMENTS

| | | |
|---|---|---|
| CN | 2818628 Y | 9/2006 |
| CN | 101057342 A | 10/2007 |

(Continued)

OTHER PUBLICATIONS

U.S. Appl. No. 13/554,527, filed Jul. 20, 2012, Tourino et al.

(Continued)

*Primary Examiner* — Seahvosh Nikmanesh

(57) ABSTRACT

A solar cell assembly, a solar cell array, and a method for manufacturing the same are provided. The solar cell assembly may include a solar cell and an interconnection member, the interconnection member comprising a first portion and a second portion attached to the first portion with an angle formed therebetween. The solar cell array may comprise at least two said solar cell assemblies. In an embodiment, the top surfaces of the first solar cell and the second solar cell are arranged such that the second portion of the first interconnect member and the second portion of the second interconnection member are adjacent to each other, and at least the end portion of the second portion of the first interconnection member is bended together with at least the end portion of the second portion of the second interconnection member.

20 Claims, 9 Drawing Sheets

(56) References Cited

FOREIGN PATENT DOCUMENTS

| CN | 201038172 Y | 3/2008 |
| CN | 101390220 A | 3/2009 |
| CN | 101483201 A | 7/2009 |
| CN | 101636848 A | 1/2010 |
| CN | 101853891 A | 10/2010 |
| JP | 2003-318430 | 7/2003 |

OTHER PUBLICATIONS

Communication and Extended European Search Report for European Patent Application No. 13020021.5 dated Sep. 30, 2013; 9 pgs.

* cited by examiner

SOLAR CELL ASSEMBLY, SOLAR CELL PANEL, AND METHOD FOR MANUFACTURING THE SAME

This application is a divisional application of patent application Ser. No. 13/535,570, filed Jun. 28, 2015, which is incorporated herein by reference in its entirety.

BACKGROUND OF THE INVENTION

1. Field of the Invention

The present invention relates to solar cell assembly, solar cell panel, and method for manufacturing the same.

2. Description of the Related Art

In recent years, solar cells have been widely used in various fields and applications. For example, solar cell assembly and solar cell array which include one or more solar cells can be applied in communication devices, electric/electronic appliances, industrial facilities, and military and aerospace applications.

For increasing the total power amount of the solar cell array, it is a possible way to increase the numbers of the solar cells in a unit area. For example, an aerospace craft (satellite, aerospace station, aerospace telescope, or the like) may have very limited area (for example, solar wings) to mount solar cells or solar cell array thereon. Thus, density of solar cells would be a particularly important aspect for aerospace applications.

On the other hand, reliability becomes a critical issue especially for aerospace applications because it is very hard, if not impossible, and costly to repair, replace, or even maintain the solar cell array mounted on an aerospace craft.

Further, since the solar wings of aerospace craft generally are folded or curled/rolled when the aerospace craft is launched into the space by a rocket or a space shuttle, it is advantageous if the aspect ratio of the solar cell array can be reduced to minimum. In other words, it is desirable to reduce the height of the solar cell array.

In addition, an aerospace craft, on which the solar cell assembly or array is mounted, generally operates in an aerospace environment in which there is no air circumference to block the space particle rays (cosmic rays). In such applications, a tip on the solar cell array may possibly cause electrical spark discharging in an aerospace environment, for example, due to the cosmic rays.

SUMMARY

According to an embodiment of the present disclosure, a solar cell assembly is provided which comprises: a solar cell, and a conductive interconnection member, the interconnection member comprising a first portion and a second portion attached to the first portion with an angle formed therebetween, wherein the first portion is attached to a top surface of the solar cell, wherein at least an end portion of the second portion is capable of being bended together with at least an end portion of an second portion of an interconnection member of another said solar cell assembly, in an operating state.

In another embodiment, a solar cell array is provided which may comprise: a first solar cell assembly comprising a first solar cell and a first conductive interconnection member, the first interconnection member comprising a first portion and a second portion attached to the first portion with an angle formed therebetween, wherein the first portion is attached to a top surface of the first solar cell, and a second solar cell assembly comprising a second solar cell and a second conductive interconnection member, the second interconnection member comprising a first portion and a second portion attached to the first portion with an angle formed therebetween, wherein the first portion of the second interconnection member is attached to a top surface of the second solar cell, wherein the first solar cell and the second solar cell are arranged adjacent to each other such that the second portion of the first interconnect member and the second portion of the second interconnection member are adjacent to each other, and wherein at least the end portion of the second portion of the first interconnection member is bended together with at least the end portion of the second portion of the second interconnection member.

In an implementation of the embodiment, at least the end portions of the second portions of the first and second interconnect members are attached to each other prior to being bended. In another implementation of the embodiment, the first and second interconnection members are formed integrally with at least the end portions of the second portions thereof attached to each other.

According to another embodiment of the present disclosure, the solar cell array may further comprise a carrier, wherein the first and second solar cells are mounted onto the carrier with bottom surfaces of the first and second solar cells facing the carrier.

According to a further embodiment of the present disclosure, a method for manufacturing a solar cell assembly is provided which comprises: providing a first solar cell assembly, the first solar cell assembly comprising a first solar cell and a first conductive interconnection member, the first interconnection member comprising a first portion and a second portion attached to the first portion with an angle formed therebetween, wherein the first portion is attached to a top surface of the first solar cell; providing a second solar cell assembly, the second solar cell assembly comprising a second solar cell and a second conductive interconnection member, the second interconnection member comprising a first portion and a second portion attached to the first portion with an angle formed therebetween, wherein the first portion of the second interconnection member is attached to a top surface of the second solar cell; arranging the first solar cell and the second solar cell adjacent to each other such that the second portion of the first interconnect member and the second portion of the second interconnection member are adjacent to each other; and bending at least the end portion of the second portion of the first interconnection member together with at least the end portion of the second portion of the second interconnection member.

In a still further embodiment, a method for manufacturing a solar cell array is provided which may comprise: providing a first solar cell; attaching a first conductive interconnection member to the first solar cell with a first portion of the interconnection member attached to a top surface of the solar cell, the interconnection member comprising the first portion and a second portion attached to the first portion with an angle formed therebetween; providing a second solar cell; attaching a second conductive interconnection member to the second solar cell with a first portion of the second interconnection member attached to a top surface of the second solar cell, the second interconnection member comprising the first portion and a second portion attached to the first portion with an angle formed therebetween; arranging the first solar cell and the second solar cell adjacent to each other such that the second portion of the first interconnect member and the second portion of the second interconnection member are adjacent to each other; and bending at least the end portion of the second portion of the first interconnection member together with at least the end portion of the second portion of the second interconnection member.

In a further embodiment, the method further comprises: attaching at least the end portions of the second portions of the first and second interconnect members are attached to each other prior to said bending. In another implementation of the embodiment, the first and second interconnection members are formed integrally with at least the end portions of the second portions thereof attached to each other.

Further aspects, features and advantages of the present invention will be understood from the following description with reference to the drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
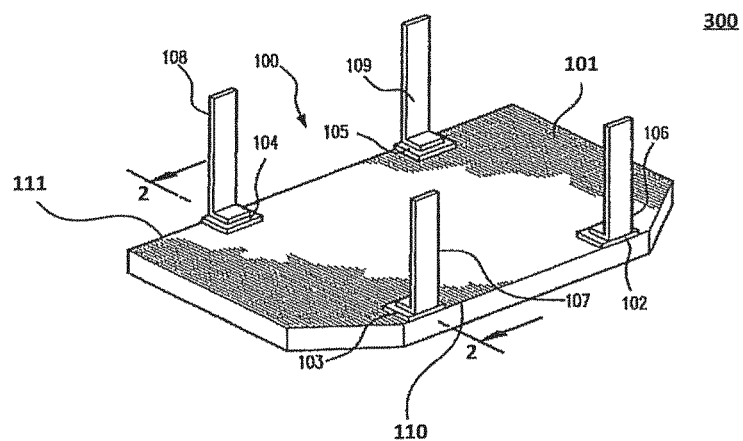
FIG. 1 is a schematic perspective view of an example of a solar cell assembly according to an embodiment of the invention.

Embodiments of the present invention will be described in detail below with reference to the drawings. Note that similar reference numerals refer to similar elements throughout the drawings, and thus repetitive descriptions thereof are omitted.

Figure 2:
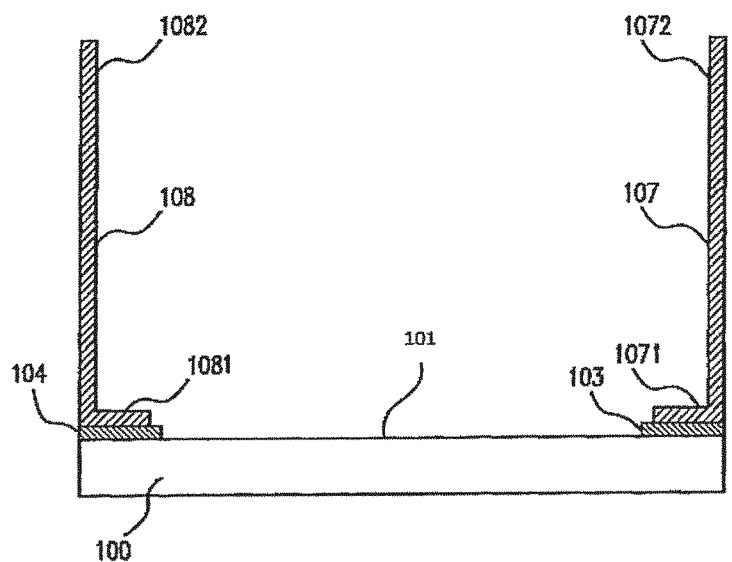
FIG. 2 illustrates a sectional view taken along the line 2-2 of FIG. 1.
Figure 3:
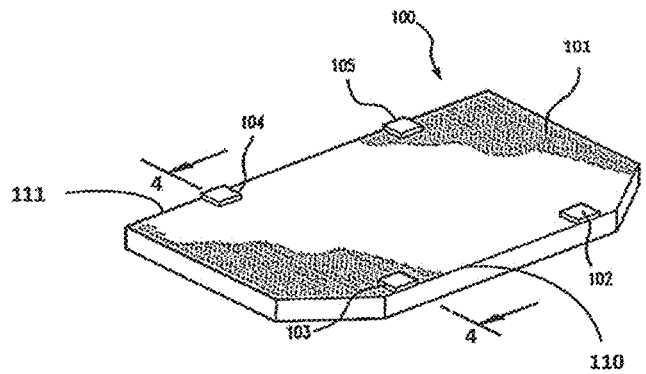
FIG. 3 is a schematic perspective view of an example of the solar cell according to the embodiment of the present disclosure.
Figure 4:
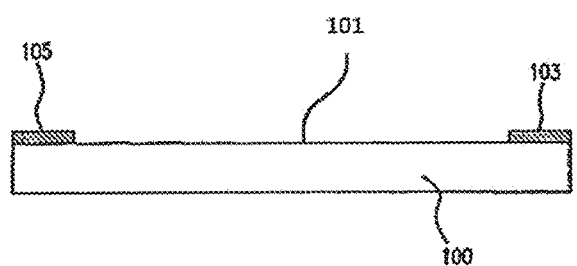
FIG. 4 illustrates a sectional view taken along the line 4-4 of FIG. 3.

FIG. 1 is a schematic perspective view of an example of a solar cell assembly 300 according to an embodiment of the invention, in which conductive interconnection members 106 through 109 are attached to a solar cell 100. FIG. 2 illustrates a sectional view taken along the line 2-2 of FIG. 1. FIG. 3 is a schematic perspective view of an example of the solar cell 100 according to the embodiment of the present disclosure. FIG. 4 illustrates a sectional view taken along the line 4-4 of FIG. 3.

According to an embodiment of the present disclosure, the solar cell assembly 300 may include a solar cell 100 and a conductive interconnection member (102, 103, 104, or 105) attached to a top surface 101 of the solar cell 100, as illustrated in FIG. 1.

The solar cell 100 (hereinafter, also referred as first solar cell) may be cut out from a wafer in which wafer a number (for example, two, or, more or less) of solar cells are manufactured as those skilled in the art would apparently understand. An example of the solar cell 100 is illustrated in FIG. 3; however, the present invention is not limited thereto.

In some preferred embodiments, as illustrated in FIG. 3, the solar cell 100 may include four (4) connection parts 102 through 105 (which can be referred as first connection parts hereinafter) formed on the top surface of the solar cell 100; however, the invention is not limited thereto as long as at least one connection part can be formed on the top surface 101 of the solar cell 100. In a preferred embodiment, there may be at least two connection parts formed on the top surface of the solar cell 100, one(s) for connection to a node of the first solar cell and other one(s) for connection to a cathode of the solar cell. Note that there may also be additional connection part(s) formed on the top surface of the solar cell for connection to/from a bypass circuit which can be formed in or external to the solar cell.

It is be noted that the connection parts 102-405 as shown are just exemplary and not for limiting the scope of the invention. For example, the connection parts 102-105 can be flush with, or recessed from, the top surface 101, although they are illustrated as being projected from the top surface 101. As a more specific example, pads formed on the top surface of the solar cell, which can be surrounded by for example a passivation layer, can be used as the connection part. Further, as the connection parts, for example, various terminals formed on the top surface of the solar cell can also be used as appropriate.

Further, it is preferable in some embodiments that the connection part is formed adjacent to an edge of the top surface of the solar cell. As shown in FIG. 3, two of the connection parts 102 and 103 are formed adjacent to an edge 110 of the top surface 101 while other two connection parts 104 and 105 are formed adjacent to an opposite edge 111 of the top surface 101. Note that the number and arrangement of the connection parts on the top surface of the solar cell should not be limited to those illustrated in the drawings.

Although the outer edges of the connection parts are illustrated as being aligned with the edge of the top surface of the solar cell in FIG. 4, the invention should not be limited thereto. For example, the outer edges of the connection parts may be slightly distanced from the edge of the top surface of the solar cell in an implementation of the embodiment.

The interconnection members 106-109 can be attached to a top surface 101 of the solar cell 100 by, for example, welding or soldering. Each of the interconnection members 106-109 includes a first portion and a second portion attached to the first portion with an angle formed therebetween. By way of example, as illustrated in FIG. 2, the interconnection members 107 and 108 each include a first portion 1071/1081 and a second portion 1072/1082 attached to the first portion with an angle (which is not specifically indicated) formed therebetween.

In a preferred embodiment, the angle formed by the first portion and the second portion of an interconnection member can be in a range from 85 degrees to 90 degrees. In a more preferred embodiment, the first portion is substantially perpendicular to the second portion, as exemplary illustrated in FIG. 2. That is, the interconnection member can be of an L-like shape in a sectional view. In some preferred embodiments, the interconnection members can be formed of metal, and for example, it can be a metal plate. As material for forming the interconnection member, molybdenum; a nickel-cobalt ferrous alloy material designed to be compatible with the thermal expansion characteristics of borosilicate glass such as that available under the trade designation Kovar from Carpenter Technology Corporation; a nickel iron alloy material having a uniquely low coefficient of thermal expansion available under the trade designation Invar, FeNi36, or 64FeNi; or the like can be used.

Further, as can be seen from FIGS. 3 and 4, the first portion and the second portion of the interconnection member can be substantially rectangular in shape. In a preferred embodiment, the interconnection member, including the first and second portions, may have a thickness in a range from about 0.0007 inches and 0.0013 inches (or between about 0.0178 mm and 0.033 mm).

In some certain embodiments, the interconnection member can be used for, among others, providing electric connection to/from the solar cell. In such a case, the first portions of the interconnection members 106-109 can be attached to respective connection parts 102-105 of the solar cell 100. In a preferred embodiment, the interconnection member are attached to a respective connection part such that the second portion thereof is closer to the edge, which is adjacent thereto, than the first portion thereof, as illustrated in FIGS. 1 and 2. In another preferred embodiment, the bottom surface of the first portion of the interconnection member (e.g., 106) is located within the top surface of the respective connection part (e.g., 102) formed on the top surface of the solar cell 100, that is to say, not out of the circumference of the connection part. In a more specific embodiment, the first portion of the interconnection member (e.g., any of 106 through 109), which is to be attached to the respective connection part formed on the top surface of the solar cell 100, has a dimension (e.g., width) approximately equal to or less than that of the respective connection part. It needs to be noted that the above embodiments are just for exemplary, and not for limiting the scope of the invention. There is no particular limitation on the shapes of the connection parts or on the deployment of the interconnection members.

As aforementioned, the number and arrangement of the connection parts formed on the top surface of the solar cell are not limited to the case as illustrated in FIGS. 1-2, accordingly, the number and arrangement of the interconnection members are also not limited to the case as illustrated in FIGS. 3-4. Note that the correspondence between the connection parts and the interconnection members is not limited to a one-to-one manner, for example, there may possibly be such a case where two interconnection members are attached to a same connection part formed on the top surface of the solar cell; and vice versa.

Further, at least an end portion of the second portion is capable of being bended together with at least an end portion of an second portion of an interconnection member of another said solar cell assembly, in an operating state. The interconnection member of another said solar cell assembly can be similar to the interconnection member as above described, and may comprise a first portion and the second portion attached to the first portion with an angle formed therebetween, and the first portion of the another interconnection member is attached to a connection part formed on a top surface of the another solar cell.

Figure 5:
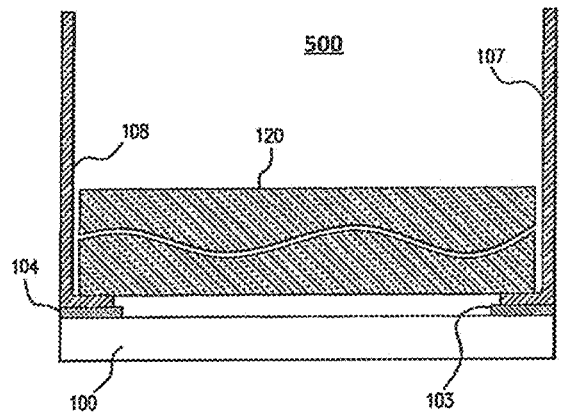
FIG. 5 is a schematic sectional view of a solar cell assembly according to another embodiment of the invention in which a glass cover is disposed above a top surface of the solar cell.

FIG. 5 is a schematic sectional view of a solar cell assembly 500 according to another embodiment of the invention in which a glass cover 120 is disposed above the top surface 101 of the solar cell 100. In an example of the embodiment, the glass cover 120 is disposed above the top surface of the solar cell 100 to which the interconnection members (e.g. 107 and 108) have been attached. That is, the glass cover is disposed above the top surface of the solar cell 100 after the interconnection member (e.g. 107) is attached to the solar cell; and the invention should not be limited thereto. It is preferable that the glass cover is transparent for lights. Since the materials for forming the glass cover and method for disposing or attaching the glass cover onto the top surface of the solar cell are not concerns of the invention, the specific descriptions thereof are omitted, and those skilled in the art can take use of the materials and methods known in the art or future developed.

According to the above embodiments of the present disclosure, the density of the solar cells, for example, in a solar cell array can be increased, that is, more solar cells can be mounted in a limited area, which would be advantageous.

Figure 6:
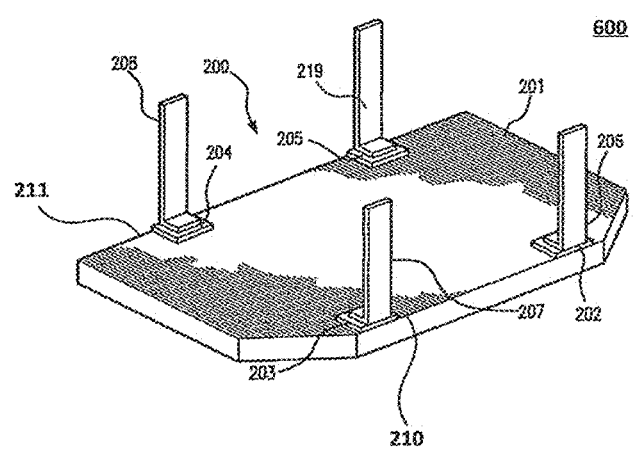
FIG. 6 is a schematic perspective view of another solar cell assembly according to the embodiment of the invention.

FIG. 6 is a schematic perspective view of another solar cell assembly 600 according to the embodiment of the invention. The solar cell assembly 600 according to this embodiment is substantially identical with that as illustrated in FIG. 1, and may comprise: a solar cell 200 (hereinafter, referred as second solar cell), and interconnection members 206 through 209 each comprising a first portion and a second portion attached to the first portion with an angle formed therebetween, wherein the first portion of the second interconnection member is attached to a top surface 201 of the second solar cell.

In this embodiment, the solar cell 200 can include connection parts (hereinafter, referred as second connection parts) 202 through 205 formed on the top surface 201 thereof and adjacent to edges of the top surface, respectively. And, the first portions of the second interconnection members 206-209 are attached to the respective connection parts 202-205 of the second solar cell.

The above descriptions with respect to the solar cell assemblies illustrated in connection with FIGS. 1-5 can also be equivalently applied to the solar cell assembly according to this embodiment, and thus, the repetitive descriptions thereof are omitted.

Figure 7:
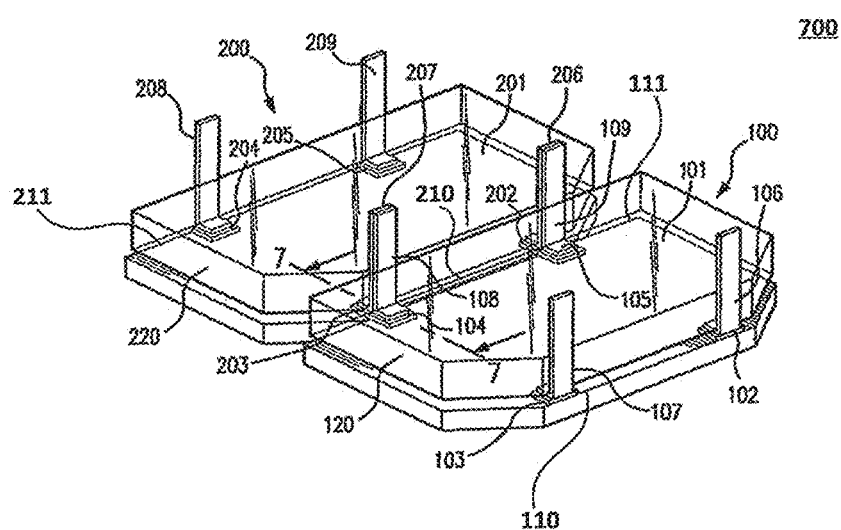
FIG. 7 is a schematic perspective view of a solar cell array according to an further embodiment of the invention.

FIG. 7 is a schematic perspective view of a solar cell array 700 according to a further embodiment of the invention, which comprises at least a first solar cell assembly (e.g., 500) and a second solar cell assembly (e.g., 600), in which the first solar cell and the second solar cell are arranged adjacent to each other. As shown, the first solar cell 100 and of the second solar cell 200 are arranged adjacent to each other such that second portions of the adjacent interconnection members for the first and second solar cells are adjacent to each other. Thus, the top surface 101 of the first solar cell 100 and the top surface 201 of the second solar cell 200 are arranged adjacent to each other, for example, laterally as illustrated in FIG. 7. In an preferred embodiment of the present disclosure, the edges 111 and 210 of the first and second solar cells which are respectively adjacent to the adjacent second portions (e.g., 108 and 207) are arranged such that a maximum distance between these two edges of the first and second solar cell is 0.15 inches or less, more preferably, no less than about 0.01 inches (or, about 0.254 mm) and no greater than about 0.15 inches (or, about 3.81 mm).

Either or both of glass covers 120 and 220 can be disposed above the respective surface(s) 101 and/or 201 of the solar cell(s), after or prior to the arranging of the top surfaces 101 and 201.

Figure 8:
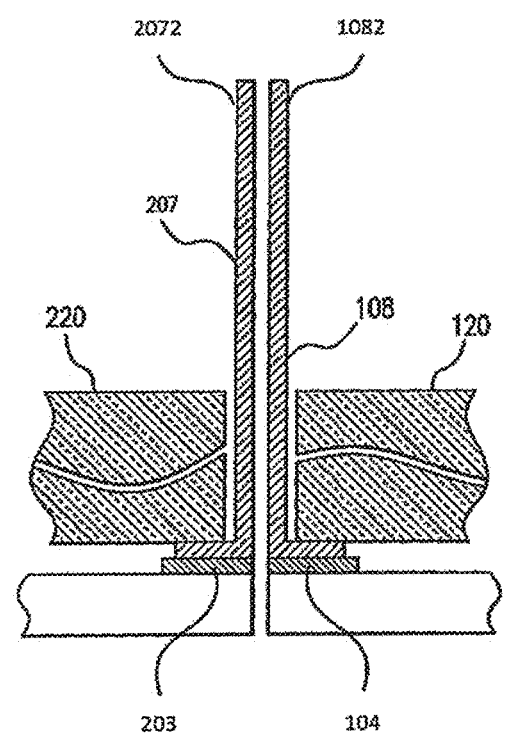
FIG. 8 is a partially sectional view of the solar cell assembly taken along the line 7-7 in FIG. 7, which illustrates the adjacent second portions of the adjacent interconnection members.

FIG. 8 is a partially sectional view of the solar cell assembly taken along the line 7-7 in FIG. 7, which illustrates the adjacent second portions 1082 and 2072 of the adjacent interconnection members 108 and 207. As can be seen from FIG.

8, the second portions (e.g., 1082 and 2072) sufficiently extend beyond the corresponding glass cover. However, the present invention is not limited to the embodiment as shown in FIG. 8. In some preferred embodiments, the length of a part of the second portion (e.g., 1082/2072) extending over a top surface of the corresponding glass cover may be in a range about from 0 to 0.1 inches (or, about 2.54 mm).

According to the above embodiments of the present disclosure, the solar cells can be disposed or mounted very close to each other, thus the density of the solar cells in a unit area can be increased. Further, according to some certain embodiments of the present disclosure, the aspect ratio of the solar cell array can be reduced, in other words, the height of the solar cell assembly and the solar cell array can be reduced. Moreover, the resistance capability against the strain or stress when the array is curled or stretched can be enhanced with use of the interconnection member according to the present disclosure.

Figure 9:
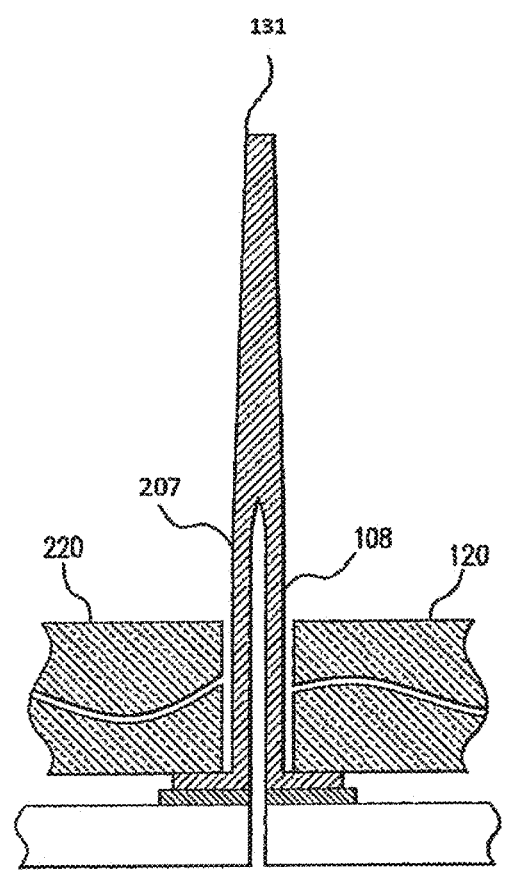
FIG. 9 illustrates a situation where at least the end portions of the two adjacent second portions of the interconnection members as illustrated in FIG. 8 are attached with each other.

Then, as illustrated in FIG. 9, at least end portions of the second portions 1082 and 2072 of the interconnection members 108 and 207 can be attached to each other. Thus, an electric connection between the respective first connection part 104 (for example, connected to a positive/plus electrode) of the first solar cell 100 and the respective second connection part 203 (for example, connected to a negative/minus electrode) of the second solar cell 200 can be made. By, this way, the solar cells can be electrically connected in series or in parallel.

Figure 10:
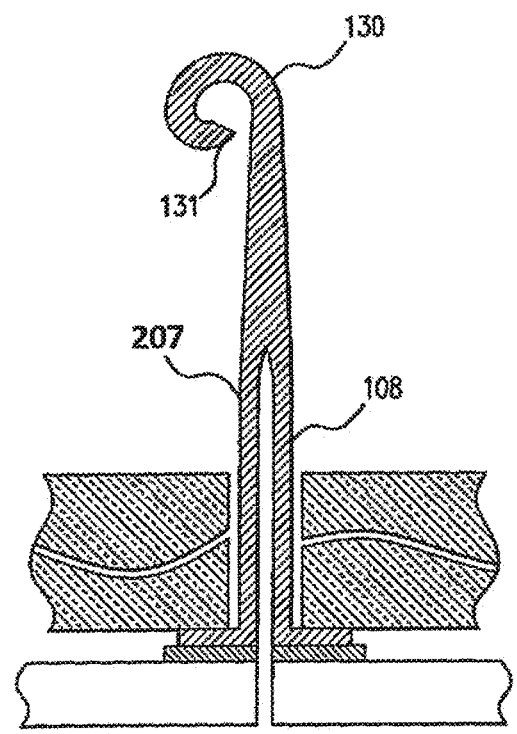
FIG. 10 is a partially sectional view of the solar cell array, in which at least the end portions of the adjacent second portions of the adjacent interconnection members as illustrated in FIG. 9 are bended.

FIG. 10 is a partially sectional view of the solar cell array, in which at least end portions of the adjacent second portions 1082 and 2072 of the adjacent interconnection members 108 and 207 as illustrated in FIG. 9 are bended together with each other. For example, they can be bended so that they can be curled or rolled into a spiral-like shape, as indicated by the reference number 130 in FIG. 10; and the present disclosure should not be limited thereto.

Because of the bending of the end portions, the aspect ratio of the solar cell array can be further reduced, in other words, the height of the solar cell array can be further reduced. This is particularly advantageous in such a case where the solar cell array needs to be curled or rolled, for example, in the case where the aerospace craft, on which the solar cell array according to the present disclosure is mounted on its wings, is being launched by a rocket into the space. Further, because of the bending of the end portions, the resistance capability against the strain or stress due to, for example, the curling or stretching of the solar cell array can be further enhanced, thus the reliability of the solar cell array can be improved.

Moreover, note that the aerospace craft on which the solar cell array according to the present disclosure is mounted generally is operated in an aerospace environment in which there is no air circumference to block the space particle rays (cosmic rays). In such applications, the tip 131 of the attached end portions of the second portions 1082 and 2072 may possibly cause sparkle discharging in an aerospace environment due to the cosmic rays. According to the above embodiments of the present disclosure, the sparkling discharge can be reduced or eliminated by reducing the length of the second portion extending over the top surface of the glass cover and/or bending the end portions.

In some examples of the embodiment, at least the end portions of the second portions 1082 and 2072 can be attached by welding, soldering, or the like, and then, the second portions 1082 and 2072 can be bended, for example, to be curled together, as illustrated in FIGS. 9 and 10. In some alternative examples of the embodiment, at least the end portions of the second portions 1082 and 2072 can be directly bended together with each other without the attaching process. Alternatively, the first and second interconnection members 108 and 207 can be integrally formed with at least the end portions of the second portions 1082 and 2072 thereof attached to each other.

According to another embodiment of the present disclosure, the solar cell array may further comprise a carrier (not shown), wherein the solar cell(s), e.g., 100 and/or 200) can be mounted on the carrier by for example, silicone adhesive, with bottom surfaces thereof facing the carrier. In an embodiment, the carrier can be formed of aluminium or titanium. In a preferred embodiment, the carrier is capable of being bended and stretched.

Accordingly, methods for manufacturing the solar cell array are also provided. Hereinafter, method for manufacturing the solar cell array according to embodiments of the present disclosure will be described with reference to FIGS. 11 and 12.

Figure 11:
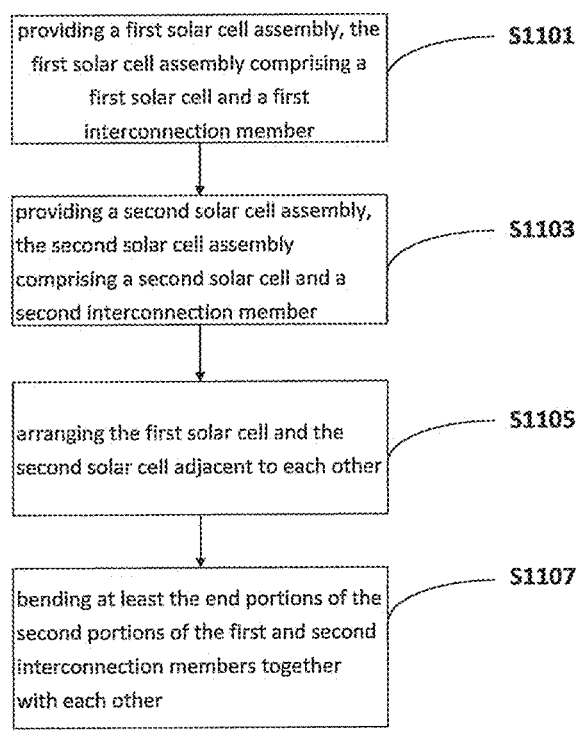
FIGS. 11 and 12 each illustrate a flow chart of an example of method for manufacturing a solar cell array according to an embodiment of the present disclosure.
Figure 12:
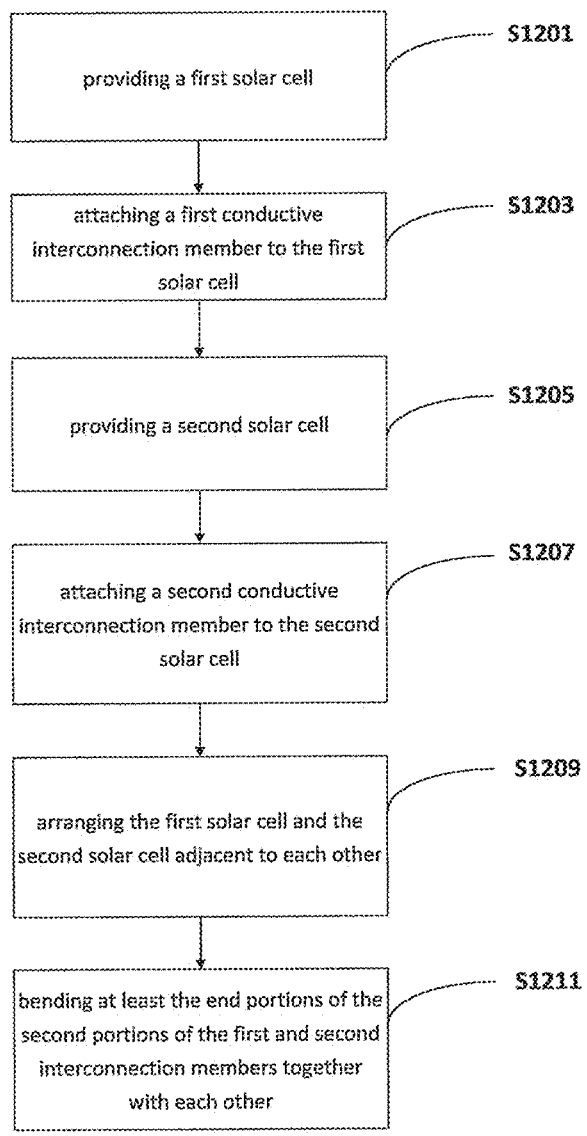

FIGS. 11 and 12 each illustrate a flow chart of an example of method for manufacturing a solar cell array according to an embodiment of the present disclosure.

A method for manufacturing a solar cell array according to an embodiment of the present disclosure may comprises: providing (S1101) a first solar cell assembly, the first solar cell assembly comprising a first solar cell and a first interconnection member, the first interconnection member comprising a first portion and a second portion attached to the first portion with an angle formed therebetween, wherein the first portion is attached to a top surface of the first solar cell; providing (S1103) a second solar cell assembly, the second solar cell assembly comprising a second solar cell and a second interconnection member, the second interconnection member comprising a first portion and a second portion attached to the first portion with an angle formed therebetween, wherein the first portion of the second interconnection member is attached to a top surface of the second solar cell; arranging (S1105) the first solar cell and the second solar cell adjacent to each other such that the second portion of the first interconnect member and the second portion of the second interconnection member are adjacent to each other; and bending (S1107) at least the end portion of the second portion of the first interconnection member together with at least the end portion of the second portion of the second interconnection member.

A method for manufacturing a solar cell array according to another embodiment of the present disclosure may comprises: providing (S1201) a first solar cell; attaching (S1203) a first interconnection member to the first solar cell with a first portion of the interconnection member attached to a top surface of the solar cell, the interconnection member comprising the first portion and a second portion attached to the first portion with an angle formed therebetween; providing (S1205) a second solar cell; attaching (S1207) a second interconnection member to the second solar cell with a first portion of the second interconnection member attached to a top surface of the second solar cell, the second interconnection member comprising the first portion and a second portion attached to the first portion with an angle formed therebetween; arranging (S1209) the first solar cell and the second solar cell adjacent to each other such that the second portion of the first interconnect member and the second portion of the second interconnection member are adjacent to each other; and bending (S1211) at least the end portion of the second portion of the first interconnection member together with at least the end portion of the second portion of the second interconnection member.

In an implementation of the embodiment, the methods may further comprise: attaching at least the end portions of the second portions of the first and second interconnect members are attached to each other prior to said bending. In another implementation of the embodiment, the first and second interconnection members are formed integrally with at least the end portions of the second portions thereof attached to each other.

In an implementation of the embodiment, said bending causes at least the end portions of the second portions of the first and second interconnection member to be curled into a spiral-like shape.

In an implementation of the embodiment, at least one of the first and second interconnection members is a metal plate with L-like shape.

In an implementation of the embodiment, at least one of the first and second interconnection members is formed of molybdenum; a nickel-cobalt ferrous alloy material designed to be compatible with the thermal expansion characteristics of borosilicate glass such as that available under the trade designation Kovar from Carpenter Technology Corporation; or a nickel iron alloy material having a uniquely low coefficient of thermal expansion available under the trade designation Invar, FeNi36, or 64FeNi.

In an implementation of the embodiment, the first and second portions of at least one of the first and second interconnection members are substantially rectangular in shape, with a thickness in a range from about 0.0007 inches to about 0.0013 inches.

In an implementation of the embodiment, the methods may further comprise: disposing a glass cover above the top surface of any one of the first and second solar cells after the corresponding interconnection member is attached to any one of the first and second solar cells.

In an implementation of the embodiment, length of a part of the second portion of said any one of the first and second solar cells extending over a top surface of the glass cover is in a range from 0 to about 0.1 inches.

In an implementation of the embodiment, each of the first and second solar cells further comprise a connection part formed on a top surface thereof and adjacent to an edge of the top surface, and wherein the first portions of the first and second interconnection members are attached to the respective connection parts of the first and second solar cell.

In an implementation of the embodiment, said attaching of any of the first and second interconnection members is carried out by any of: welding or soldering.

In an implementation of the embodiment, said arranging causes that a maximum distance between the respective edges of the first and second solar cells adjacent to the first and second interconnection members is 0.15 inches or less.

In an implementation of the embodiment, the first solar cell includes at least two said first connection parts, one of the first connection parts for connection to a node of the first solar cell and another one of the first connection parts for connection to a cathode of the first solar cell.

In an implementation of the embodiment, said attaching of a first interconnection member comprises: attaching at least two said first interconnection members to the respective first connection parts of the first solar cell.

In an implementation of the embodiment, said attaching of at least one of the first and second interconnection members causes that the second portion of said at least one of the first and second interconnection members is closer to the corresponding edge, which is adjacent thereto, than the first portion thereof.

In an implementation of the embodiment, the method may further comprise mounting the first and second solar cells onto the carrier with bottom surfaces of the first and second solar cells facing the carrier. Said mounting step can be performed after or before the interconnection member(s) for the first and/or the second solar cell is attached to the respective solar cell(s), depending on different implementations of the embodiment.

Note that the embodiments of the present disclosure can be freely combined with each other without departing from the spirit and scope of the invention.

It is possible to embody the solar cell assemblies, solar cell arrays, and the methods for manufacturing the same of the present disclosure in various ways. The above described orders of the steps for the methods are only intended to be illustrative, and the steps of the methods of the present disclosure are not limited to the above specifically described orders unless otherwise specifically stated.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

What is claimed is:

1. A solar cell array comprising:
a first solar cell having a first terminal disposed on one side of the solar cell adjacent a first edge of the first solar cell, and a second terminal disposed on said one side of the solar cell adjacent a second edge of the first solar cell opposite to the first edge;
a first metal interconnection member having an L-shape, with a bottom first portion and a second portion attached to said first portion of the first metal interconnection member and extending perpendicular thereto above the surface of the first solar cell, the bottom first portion of the first metal interconnection member being attached to the first terminal of the first solar cell; and
a second metal interconnection member having an L-shape, with a bottom first portion, and a second portion attached to said first portion of the second metal interconnection member and extending perpendicular thereto above the surface of the first solar cell, the bottom first portion of the second metal interconnection member being attached to the second terminal of the first solar cell.

2. A solar cell array as defined in claim 1, wherein the first metal interconnection member and/or the second metal interconnection member are composed of molybdenum, a nickel-cobalt ferrous alloy material, or a nickel iron alloy material.

3. A solar cell array as defined in claim 1, wherein the first metal interconnection member and/or the second metal interconnection member are substantially rectangular in shape, with a thickness of between 0.0007 and 0.0013 inches.

4. A solar cell array as defined in claim 1, further comprising a carrier supporting the solar cell array.

5. A solar cell array as defined in claim 4, wherein the carrier is composed of aluminum or titanium.

6. A solar cell array as defined in claim 4, wherein the carrier is attached to the solar cell array with a silicone adhesive.

7. A solar cell array as defined in claim 1, wherein the end portion of the attached second portions of the first and second interconnection members are bent so that the end portion is rolled into a spiral.

8. A solar cell array as defined in claim 1, further comprising a cover glass disposed over the top surface of the first solar cell.

9. A solar cell array as defined in claim 8, wherein the height of the second portion of the first interconnection member over the top surface of the cover glass ranges between 0.0 and 0.1 inch.

10. A solar cell array as defined in claim 1, wherein the first terminal corresponds to an anode terminal of the solar cell, and the second terminal corresponds to a cathode terminal of the solar cell.

11. A solar cell array comprising:
a first solar cell having a first terminal disposed on one side of the solar cell adjacent a first edge of the first solar cell, and a second terminal disposed on said one side of the solar cell adjacent a second edge of the first solar cell opposite to the first edge;
a second solar cell having a first terminal disposed on one side of the second solar cell adjacent a first edge of the second solar cell, and a second terminal disposed on said one side of the second solar cell adjacent a second edge of the second solar cell opposite to the first edge of the second solar cell;
a first metal interconnection member having an L-shape, with a bottom first portion and a second portion attached to said first portion of the first metal interconnection member and extending perpendicular thereto above the surface of the first solar cell; the bottom first portion of the first metal interconnection member being attached to the first terminal of the first solar cell; and
a second metal interconnection member having an L-shape, with a bottom first portion, and a second portion attached to said first portion of the second metal interconnection member and extending perpendicular thereto above the surface of the first solar cell, the bottom first portion of the second metal interconnection member being attached to the second terminal of the first solar cell.

12. A solar cell array as defined in claim 11, wherein the metal interconnection member is composed of molybdenum, a nickel-cobalt ferrous alloy material, or a nickel iron alloy material.

13. A solar cell array as defined in claim 11, wherein the metal interconnection member is substantially rectangular in shape, with a thickness of between 0.0007 and 0.0013 inches.

14. A solar cell array as defined in claim 11, further comprising a carrier supporting the solar cell array.

15. A solar cell array as defined in claim 14, wherein the carrier is composed of aluminum or titanium.

16. A solar cell array as defined in claim 14, wherein the carrier is attached to the solar cell array with a silicone adhesive.

17. A solar cell array as defined in claim 11, wherein the end portion of the attached second portions of the first and second interconnection members are bent so that the end portion is rolled into a spiral.

18. A solar cell array as defined in claim 11, further comprising a cover glass disposed over the top surface of the first solar cell.

19. A solar cell array as defined in claim 18, wherein the height of the second portion of the first interconnection member over the top surface of the cover glass ranges between 0.0 and 0.1 inch.

20. A solar cell array comprising:
a first solar cell having a first terminal disposed on one side of the solar cell adjacent a first edge of the first solar cell, and a second terminal disposed on said one side of the solar cell adjacent a second edge of the first solar cell opposite to the first edge;
a second solar cell having a first terminal disposed on one side of the second solar cell adjacent a first edge of the second solar cell, and a second terminal disposed on said one side of the second solar cell adjacent a second edge of the second solar cell opposite to the first edge of the second solar cell;
a first metal interconnection member having an L-shape, with a bottom first portion and a second portion attached to said first portion of the first metal interconnection member and extending perpendicular thereto above the surface of the first solar cell; the bottom first portion of the first metal interconnection member being attached to the first terminal of the first solar cell;
a second metal interconnection member having an L-shape, with a bottom first portion, and a second portion attached to said first portion of the second metal interconnection member and extending perpendicular thereto above the surface of the first solar cell, the bottom first portion of the second metal interconnection member being attached to the second terminal of the first solar cell;
a third metal interconnection member having an L-shape, with a bottom first position having a width approximately equal to or less than the width of the first terminal of the second solar cell, and a second portion attached to said first portion of the third metal interconnection member and extending perpendicular thereto, the bottom first portion of the third metal interconnection member is attached to the first terminal of the second solar cell;
a fourth metal interconnection member having an L-shape, with a bottom first portion having a width approximately equal to or less than the width of the second terminal of the second solar cell, and a second portion attached to said first portion of the second metal interconnection member and extending perpendicular thereto and along the end of the second solar cell and extending above said one side of the second solar cell, the bottom first portion of the fourth metal interconnection member being attached to the second terminal of the second solar cell;
the first edge of the second solar cell being aligned with the second edge of the second solar cell so that the two edges are substantially parallel and uniformly spaced apart by no less than 0.01 inches and no greater than 0.15 inches, and the second portion of the first metal interconnection member is adjacent the second portion of the fourth metal interconnection member; and
the second portion of the first metal interconnection member being attached to the second portion of the fourth metal interconnection member bottom so that an electrically conductive interconnection is made between the first terminal of the first solar cell to the second terminal of the second solar cell.

* * * * *